(12) United States Patent
Kasanyal et al.

(10) Patent No.: US 9,391,602 B1
(45) Date of Patent: Jul. 12, 2016

(54) DIFFERENTIAL DRIVER CIRCUIT AND METHOD FOR CONTROLLING A DIFFERENTIAL DRIVER CIRCUIT

(71) Applicant: NXP B.V., Eindhoven (NL)

(72) Inventors: Sunil Chandra Kasanyal, Pithoragarh (IN); Jitendra Dhasmana, Bangalore (IN)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/875,582

(22) Filed: Oct. 5, 2015

(51) Int. Cl.
*H03K 5/22* (2006.01)
*H03K 17/16* (2006.01)
*H03K 19/0185* (2006.01)

(52) U.S. Cl.
CPC ...... *H03K 17/162* (2013.01); *H03K 19/018528* (2013.01)

(58) Field of Classification Search
CPC .............................. H03K 5/2481; H03K 5/249
USPC ................... 327/108–112, 427, 434, 437, 65; 326/82, 83
See application file for complete search history.

(56) References Cited

U.S. PATENT DOCUMENTS

| | | | | |
|---|---|---|---|---|
| 5,939,904 A | * | 8/1999 | Fetterman | H03F 3/45224 327/65 |
| 6,107,859 A | * | 8/2000 | Moyal | H03F 3/4565 326/82 |
| 6,285,232 B1 | * | 9/2001 | Hasegawa | H03K 19/018528 327/108 |
| 6,943,588 B1 | * | 9/2005 | Luo | H03K 19/00369 326/115 |
| 7,236,018 B1 | * | 6/2007 | Wang | H03F 1/0205 326/83 |
| 7,598,779 B1 | * | 10/2009 | Wang | H03K 19/018528 327/108 |
| 7,746,121 B2 | | 6/2010 | Khoury et al. | |
| 2003/0085736 A1 | | 5/2003 | Tinsley et al. | |
| 2006/0066393 A1 | | 3/2006 | Davis et al. | |
| 2010/0231266 A1 | | 9/2010 | Kishor | |
| 2011/0210774 A1 | | 9/2011 | Behel | |
| 2012/0112794 A1 | * | 5/2012 | Chao | H03K 19/00384 327/65 |

OTHER PUBLICATIONS

LVDS standard IEEE Std 1596.3-1996 (IEEE Standard for Low-Voltage Differential Signals (LVDS) for Scalable Coherent Interface (SCI)); 34 pgs.; Mar. 21, 1996.

* cited by examiner

*Primary Examiner* — Lincoln Donovan
*Assistant Examiner* — Thomas Skibinski (57) ABSTRACT

Embodiments of a differential driver circuit and a method for controlling a differential driver circuit are described. Embodiments of a differential driver circuit may include a current steering circuit configured to determine a current direction through differential output terminals of the differential driver circuit, two resistors connected between the differential output terminals of the differential driver circuit and first and second semiconductor circuits connected to a point between the two resistors. The first and second semiconductor circuits are of different types. The source terminals of the first and second semiconductor circuits are connected to the point between the two resistors.

20 Claims, 9 Drawing Sheets

DIFFERENTIAL DRIVER CIRCUIT AND METHOD FOR CONTROLLING A DIFFERENTIAL DRIVER CIRCUIT

BACKGROUND

Differential communication interfaces can be used for high-speed inter-integrated circuit (IC) communication. However, in high-speed differential communication, maintaining signal integrity and achieving low bit error rate can be challenging. For example, signal reflection due to impedance mismatch, common mode noise and crosstalk can cause an increase in inter symbol interference and hence cause an increase in the bit error rate. Common mode noise, mainly caused by crosstalk and signal reflections due to impedance mismatch, can produce high electromagnetic radiation, which degrades system performance.

SUMMARY

Embodiments of a differential driver circuit and a method for controlling a differential driver circuit are described. Embodiments of a differential driver circuit may include a current steering circuit configured to determine a current direction through differential output terminals of the differential driver circuit, two resistors connected between the differential output terminals of the differential driver circuit and a first semiconductor circuit and a second semiconductor circuit connected to a point between the two resistors. The first and second semiconductor circuits are of different types. The source terminals of the first and second semiconductor circuits are connected to the point between the two resistors.

In an embodiment, resistance values of the two resistors are identical to each other.

In an embodiment, gate terminals of the first and second semiconductor circuits are connected to different bias voltages. In an embodiment, the first semiconductor circuit includes an NMOS transistor, the second semiconductor circuit includes a PMOS transistor, and a gate terminal of the NMOS transistor is connected to a first bias voltage and a gate terminal of the PMOS transistor is connected to a second bias voltage. In an embodiment, a difference between the first bias voltage and the second bias voltage is equal to a sum of threshold voltages of the NMOS transistor and the PMOS transistor. In an embodiment, the first bias voltage is equal to a sum of a reference voltage and the threshold voltage of the NMOS transistor and the second bias voltage is equal to a voltage difference between the reference voltage and the threshold voltage of the PMOS transistor.

In an embodiment, drain terminals of the first and second semiconductor circuits are connected to different supply voltages. In an embodiment, the first semiconductor circuit includes an NMOS transistor, the second semiconductor circuit includes a PMOS transistor, a drain terminal of the NMOS transistor is connected to a positive supply voltage and a drain terminal of the PMOS transistor is connected to the ground.

In an embodiment, the current steering circuit is configured to determine the current direction through the differential output terminals of the differential driver circuit based on complementary signals. In an embodiment, the current steering circuit includes a first PMOS transistor, a second PMOS transistor, a first NMOS transistor and a second NMOS transistor, gate terminals of the first and second PMOS transistors are connected to the complementary signals and gate terminals of the first and second NMOS transistors are connected to the complementary signals. In an embodiment, the differential output terminals of the differential driver circuit include a first differential output terminal and a second differential output terminal, the first differential output terminal is connected to drain terminals of the first PMOS transistor and the first NMOS transistor and the second differential output terminal is connected to drain terminals of the second PMOS transistor and the second NMOS transistor. In an embodiment, the differential driver circuit further includes a current source and a current sink, the current source is connected to source terminals of the first and second PMOS transistors and the current sink is connected to source terminals of the first and second NMOS transistors.

In an embodiment, the differential driver circuit is a Low Voltage Differential Signalling (LVDS) driver circuit. In an embodiment, a differential driver system includes the differential driver circuit, a complementary signal generation circuit configured to generate complementary signals for the differential driver circuit and bias voltage generation circuits configured to generate bias voltages for the differential driver circuit.

In an embodiment, a Low Voltage Differential Signalling (LVDS) driver circuit includes a current steering circuit configured to determine a current direction through differential output terminals of the LVDS driver circuit, two resistors connected between the differential output terminals of the LVDS driver circuit and an NMOS transistor and a PMOS transistor connected to a point between the two resistors. Resistance values of the two resistors are identical to each other. Source terminals of the NMOS transistor and the PMOS transistor are connected to the point between the two resistors and gate terminals of the NMOS transistor and the PMOS transistor are connected to different bias voltages.

In an embodiment, a drain terminal of the NMOS transistor is connected to a positive supply voltage and a drain terminal of the PMOS transistor is connected to the ground.

In an embodiment, the gate terminal of the NMOS transistor is connected to a first bias voltage, the gate terminal of the PMOS transistor is connected to a second bias voltage, the first bias voltage is equal to a sum of a reference voltage and a threshold voltage of the NMOS transistor and the second bias voltage is equal to a voltage difference between the reference voltage and a threshold voltage of the PMOS transistor.

In an embodiment, the differential output terminals of the differential driver circuit are connected to drain terminals of a plurality of PMOS transistors and a plurality of NMOS transistors of the current steering circuit.

In an embodiment, the LVDS driver circuit further includes a current source and a current sink. The current source is connected to source terminals of the PMOS transistors of the current steering circuit and the current sink is connected to source terminals of the NMOS transistors of the current steering circuit.

In an embodiment, a method for controlling a differential driver circuit involves applying complementary signals to a current steering circuit of the differential driver circuit to determine a current direction through differential output terminals of the differential driver circuit and applying different bias voltages to gate terminals of first and second semiconductor circuits of the differential driver circuit. Source terminals of the first and second semiconductor circuits are connected to a point between two resistors of identical resistance values. The two resistors are connected between the differential output terminals of the differential driver circuit. The first and second semiconductor circuits are of different types.

Other aspects in accordance with the invention will become apparent from the following detailed description,

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
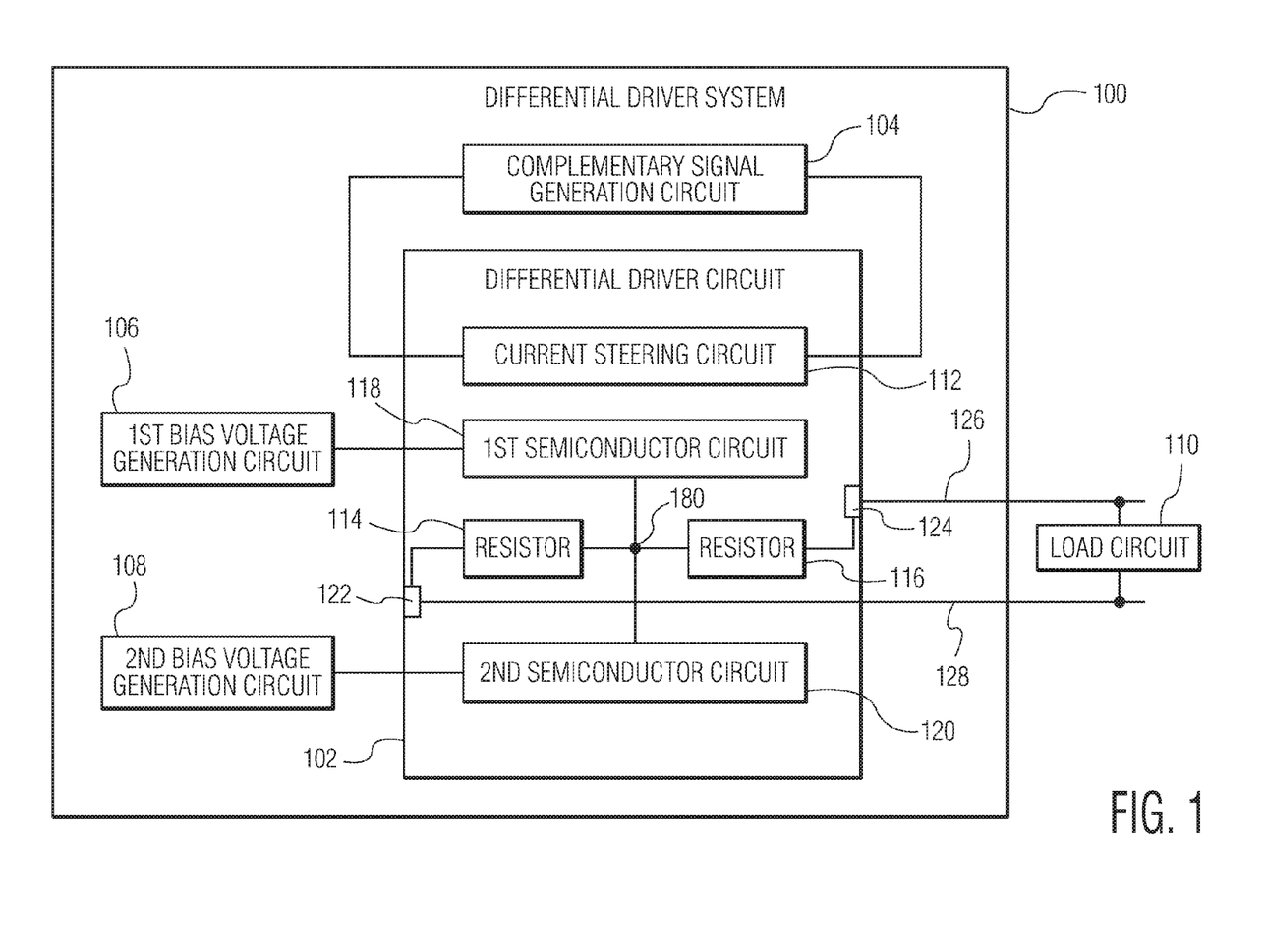
FIG. 1 depicts a schematic block diagram of a differential driver system in accordance with an embodiment of the invention.

FIG. 1 depicts a schematic block diagram of a differential driver system 100 in accordance with an embodiment of the invention. In the embodiment depicted in FIG. 1, the differential driver system includes a differential driver circuit 102, a complementary signal generation circuit 104, a first bias voltage generation circuit 106 and a second bias voltage generation circuit 108. The differential driver system is configured to generate differential output signals for a load circuit 110, which is connected between differential lines 126, 128 coupled to differential output terminals 122, 124 of the differential driver circuit. The differential driver system can be used for various differential communication protocols/interfaces. Examples of differential communication protocols/interfaces that the differential driver system can be used for include, but not limited to, Low Voltage Differential Signalling (LVDS), Current mode logic (CML), High-Definition Multimedia Interface (HDMI), DisplayPort and Universal Serial Bus (USB) 2.0/3.0. The differential driver system can be used in various applications. In some embodiments, the differential driver system is used in an automotive application, such as an in-vehicle radio system or an in-vehicle radar system. The differential driver system can be implemented as a standalone device or integrated into an electronic device. In some embodiments, the differential driver system is implemented in an integrated circuit.

The differential driver circuit 102 of the differential driver system 100 includes a current steering circuit 112, two resistors 114, 116, a first semiconductor circuit 118 and a second semiconductor circuit 120. The current steering circuit is configured to determine a current direction through the differential output terminals 122, 124 of the differential driver circuit. The two resistors are connected between the differential output terminals of the differential driver circuit. The first semiconductor circuit and the second semiconductor circuit are connected to a point 180 between the two resistors. In some embodiments, the first and second semiconductor circuits are of different types and source terminals of the first and second semiconductor circuits are connected to the point between the two resistors. The complementary signal generation circuit 104 of the differential driver system 100 is configured to generate complementary signals for the current steering circuit 112. In some embodiments, the current steering circuit includes at least one pair of PMOS or NMOS transistors and the complementary signal generation circuit generates complementary signals for the pair of transistors of the current steering circuit.

The first bias voltage generation circuit 106 of the differential driver system 100 is configured to generate a first bias voltage for the first semiconductor circuit 118 of the differential driver circuit. The second bias voltage generation circuit 108 of the differential driver system is configured to generate a second bias voltage for the second semiconductor circuit 120 of the differential driver circuit.

When there is common mode noise on the differential lines 126, 128 connected to the differential output terminals, the voltage at the point between the two resistors will either increase or decrease and turn on either the first semiconductor circuit or the second semiconductor circuit. The common mode output impedances are provided by the impedance of the turned-on semiconductor circuit in combination with the two resistors. Because the output impedances of at both differential output terminals are provided by the same devices, the output impedances at both differential output terminals are matched.

The differential driver circuit 102 can provide single-ended output impedance, which helps to absorb common mode noise and hence help to reduce electromagnetic radiation. In addition, the differential driver circuit can provide matched output impedances at the differential output terminals 122, 124, which help to absorb common mode noise by equal amount and hence prevent the conversion of common mode noise into differential noise. Consequently, electromagnetic radiation and bit error rate of the differential driver circuit are reduced and the signal integrity of the differential driver circuit is improved.

In some embodiments, the differential driver system 100 is an LVDS driver system. LVDS is a differential and serial communications protocol that transmits information as the difference between voltages carried on a pair of wires. In an example of an LVDS communication system, a constant current of 3.5 mA is injected into wires, with the direction of current determining the digital logic level. The injected current passes through a termination resistor of about 100 ohms (matched to the cable's characteristic impedance to reduce reflections) at the receiving end, and then returns in the opposite direction via the other wire. From Ohm's law, the voltage difference across the resistor is therefore typically about 350 mV. An LVDS receiver senses the polarity of the voltage difference to determine the logic level.

Figure 2:
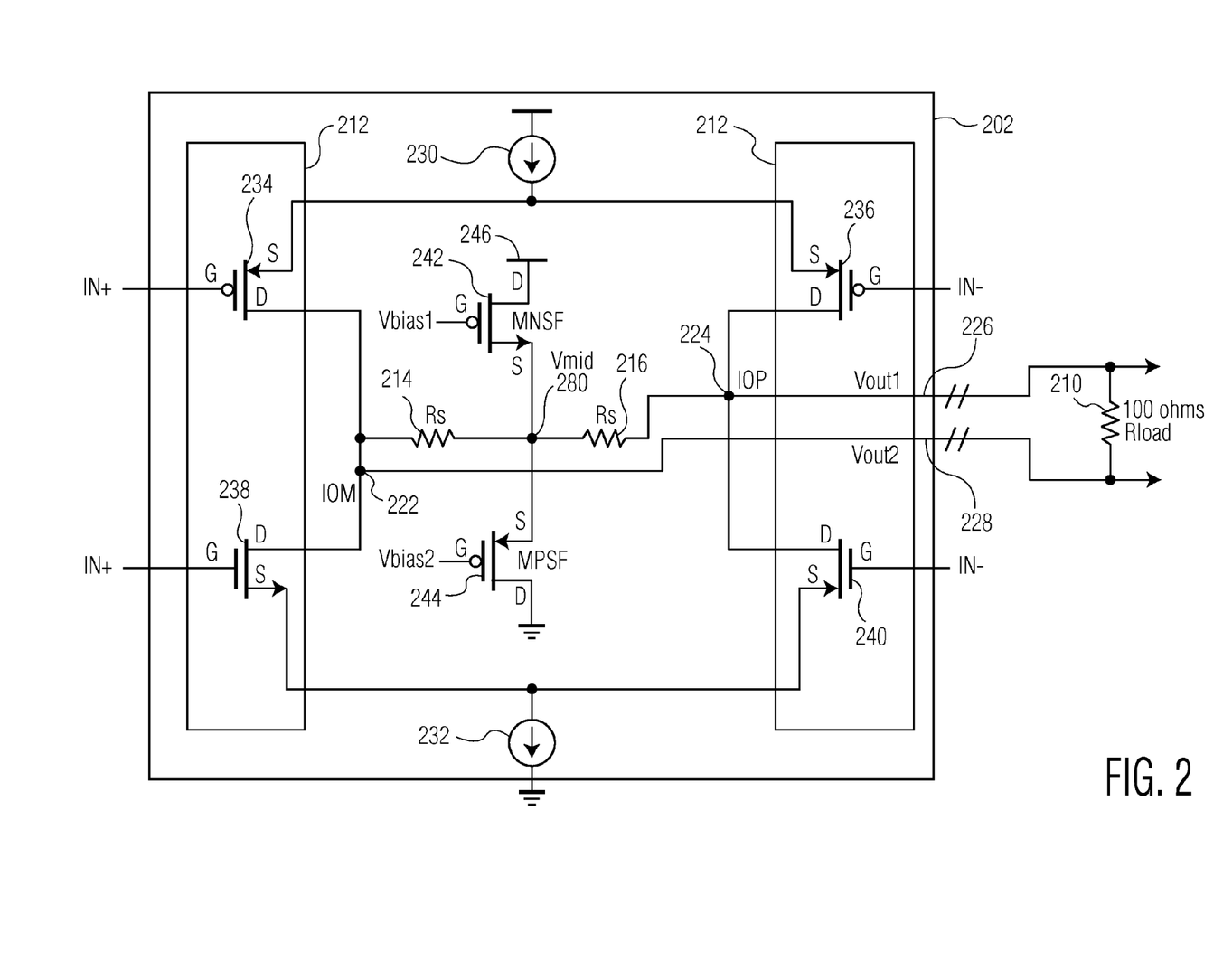
FIG. 2 depicts a schematic circuit diagram of one embodiment of a Low Voltage Differential Signalling (LVDS) driver circuit.

FIG. 2 depicts a schematic circuit diagram of one embodiment of an LVDS driver circuit 202. The LVDS driver circuit depicted in FIG. 2 is an embodiment of the differential driver circuit 102 depicted in FIG. 1. However, the differential driver circuit depicted in FIG. 1 is not limited to the embodiment depicted in FIG. 2.

In the embodiment depicted in FIG. 2, the LVDS driver circuit 202 includes a current source 230, a current sink 232, a current steering circuit 212 that includes PMOS transistors 234, 236 and NMOS transistors 238, 240, an NMOS transistor "MNSF" 242, a PMOS "MPSF" 244, two resistors 214, 216, and two differential output terminals, "TOP," 224 and "TOM," 222. The LVDS driver circuit generates differential output signals, "Vout1," "Vout2," and supplies the differential output signals through the differential output terminals TOP and TOM and corresponding differential lines 226, 228 to a load circuit 210, which may be a 100-ohm resistor or other suitable load circuit.

As described in details below, the LVDS driver circuit 202 can provide fully matched singled-ended output impedance for high-speed communication. For example, the LVDS driver circuit provides the single-ended output impedance to absorb the common mode noise on the differential lines 226, 228. In the absence of single-ended output impedance, common mode noise on differential lines can get reflected multiple times and cause electromagnetic interference that degrades the system performance. Consequently, the LVDS driver circuit can improve the overall system performance. In addition, the LVDS driver circuit provides perfect matching of output impedances, which absorbs the common mode noise by equal amount. If the output impedances are not identical to each other, common mode noise will get reflected by different magnitude and common mode noise will get converted into differential noise, which increases the bit error rate. Consequently, the LVDS driver circuit can improve the bit-error rate of the communication. Further, the LVDS driver circuit provides differential termination for the load circuit 210. If there is mismatch between differential impedance of transmission media and far end differential termination, there will be differential reflections. Output impedance of driver will help to absorb these reflections and hence improving the bit-error rate.

In the current steering circuit 212 depicted in FIG. 2, the PMOS transistors 234, 236 and the NMOS transistors 238, 240 of the current steering circuit 212 are controlled by complementary signals, "IN+," "IN−," which can be generated by the complementary signal generation circuit 104 (depicted in FIG. 1). Specifically, gate terminals G of the PMOS transistor 234 and the NMOS transistor 238 are controlled by the digital signal IN+, and gate terminals G of the PMOS transistor 236 and the NMOS transistor 240 are controlled by the digital signal IN−. The differential output terminal TOM is connected to drain terminals D of the PMOS transistor 234 and the NMOS transistor 238 and the differential output terminal IOP is connected to drain terminals D of the PMOS transistor 236 and the NMOS transistor 240. The current source 230 is connected to source terminals S of the PMOS transistors 234, 236 and the current sink 232 is connected to source terminals S of the NMOS transistors 238, 240.

In the LVDS driver circuit 202 depicted in FIG. 2, the two resistors 214, 216 are connected between the differential output terminals IOP and TOM of the LVDS driver circuit and have identical resistance values, "Rs." The point or node 280 between the two resistors is the node to which the two resistors, the NMOS transistor MNSF and the PMOS transistor MPSF are connected. The voltage, "$V_{mid}$," at the point defines the common mode voltage of the LVDS driver output. According to the LVDS standard as defined by IEEE Std 1596.3-1996, the voltage $V_{mid}$ at the point is typically 1.2V.

In the embodiment depicted in FIG. 2, transistors MNSF and MPSF are connected as source followers. Specifically, the source terminal S of the NMOS transistor MNSF is connected to the point, and the drain terminal D of the NMOS transistor MNSF is connected to a supply voltage 246. The source terminal S of the PMOS transistor MPSF is also connected to the point, and the drain terminal D of the PMOS transistor MPSF is connected to the ground.

In the LVDS driver circuit 202 depicted in FIG. 2, the gate terminal G of the NMOS transistor MNSF is controlled by a first bias voltage, "$V_{bias1}$," and the gate terminal G of the PMOS transistor MPSF is controlled by a second bias voltage, "$V_{bias2}$." The approximate values of the bias voltages Vbias1 and Vbias2 can be expressed as follows:

$$V_{bias1} = V_{mid} + V_{th(MNSF)}, \qquad (1)$$

$$V_{bias2} = V_{mid} - V_{th(MPSF)}, \qquad (2)$$

where $V_{th(MNSF)}$ represents the threshold voltage of the NMOS transistor MNSF and $V_{th(MPSF)}$ represents the absolute value of the threshold voltage of the PMOS transistor MPSF. In the embodiment depicted in FIG. 2, the gate voltage $V_{bias1}$ of the NMOS transistor MNSF is above the voltage $V_{mid}$ at the point 280 and the gate voltage $V_{bias2}$ of the PMOS transistor MPSF is lower than the voltage $V_{mid}$ at the point. According to the LVDS standard (as defined by IEEE Std 1596.3-1996), the typical value of the common mode voltage $V_{mid}$ is 1.2V. Consequently, the gate voltage $V_{bias1}$ of the NMOS transistor MNSF is one transistor threshold above 1.2V and the gate voltage $V_{bias2}$ of the PMOS transistor MPSF is one transistor threshold lower than 1.2V. Because of the biasing voltage conditions, both the PMOS transistor MPSF and the NMOS transistor MNSF remain almost off when the common mode voltage $V_{mid}$ stays at its typical value of 1.2V.

As a result of the symmetrical layout of the resistor 216 connected between the differential output terminals IOP and $V_{mid}$ and the resistor 214 connected between TOM and $V_{mid}$, a complete impedance matching can be achieved and the conversion of common mode noise into differential noise can be avoided. When there is a common mode noise of positive magnitude presented on the differential lines 226, 228, the common mode voltage $V_{mid}$ will increase from its typical value of 1.2V. The increases of the voltage $V_{mid}$ reduce the gate-to-source voltage of the NMOS transistor MNSF and further turn the NMOS transistor MNSF off, while the gate-to-source voltage of the PMOS transistor MPSF increases, which turns on the PMOS transistor MPSF. In this situation, the output impedance ($R_{IOP}$) at the output terminal IOP and the output impedance ($R_{IOM}$) at the output terminal TOM can be expressed as:

$$R_{IOP}=R_s+1/g_{m(MPSF)}, \quad (3)$$

$$R_{IOM}=R_s+1/g_{m(MPSF)}, \quad (4)$$

As confirmed by equations (3), (4), the output impedances at both the output terminals IOP and TOM are identical to each other when there is a common mode noise of positive magnitude presented on the differential lines.

Similarly, when there is a common mode noise of negative magnitude presented on the differential lines 226, 228, the common mode voltage $V_{mid}$ will decrease from its typical value of 1.2V. The decreases of the common mode voltage $V_{mid}$ reduces the gate-to-source voltage of the PMOS transistor MPSF and further turns the PMOS transistor MPSF off, while the gate-to-source voltage of the NMOS transistor MNSF increases, which turns on the NMOS transistor MNSF. In this situation, the output impedance ($R_{IOP}$) at the output terminal IOP and the output impedance ($R_{IOM}$) at the output terminal TOM can be expressed as:

$$R_{IOP}=R_s+1/g_{m(MNSF)}, \quad (5)$$

$$R_{IOM}=R_s+1/g_{m(MNSF)}, \quad (6)$$

As confirmed by equations (5), (6), the output impedances of both the output terminals IOP and TOM are identical to each other when there is a common mode noise of negative magnitude presented on the differential lines.

Values of the output impedances at the output terminals IOP and TOM of the LVDS driver circuit 202 can be decided based on the requirement of the common mode output impedance. For example, if requirement of common mode output impedance is 50 ohm (e.g., to match the common mode impedance of PCB trace), the summation of one of the resistance value $R_s$ of the resistor 214 or the resistor 216 and $1/g_m$ of the NMOS transistor MNSF or the PMOS transistor MPSF is 50 ohm. For example, the resistance value $R_s$ of the resistors can be set to 25 ohm and $1/g_{m(MNSF)}$ or $1/g_{m(MPSF)}$ can be set to 25 ohm. When the common mode impedance of trace and the common mode output impedance of LVDS driver circuit match each other, all common mode noise is absorbed such that the common mode noise is not converted into differential noise. When the output impedances at the output terminals IOP and IOM are set to 100 ohm, the resistance value $R_s$ of the resistors can be set to 75 ohm and $1/g_{m(MNSF)}$ and $1/g_{m(MPSF)}$ can be set to 25-ohm. In this case, if PCB trace impedance is 50 ohm, then 33% of the common mode noise will get reflected and the reflections on both the line will remain same such that it will not get converted into differential noise.

Figure 3A:
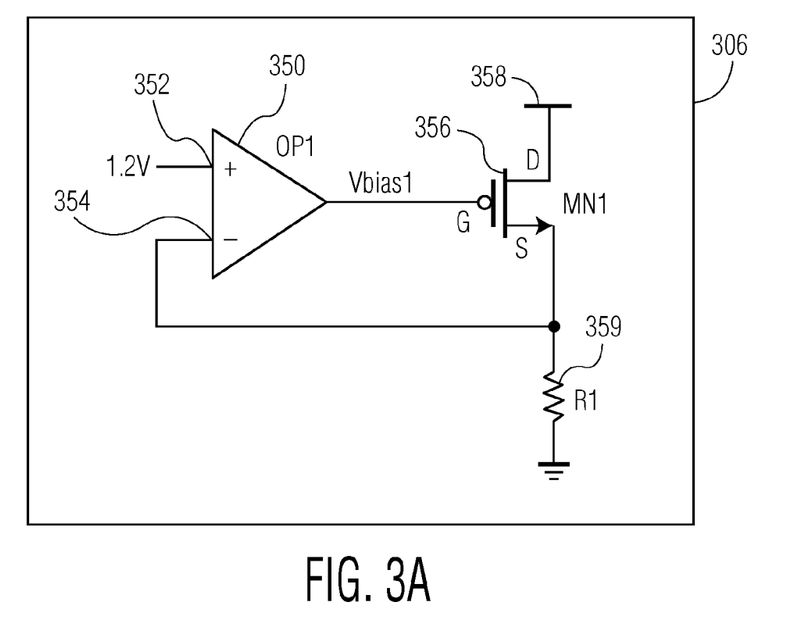
FIG. 3A depicts an embodiment of a first bias voltage generation circuit.

FIG. 3A depicts an embodiment of a bias voltage generation circuit 306 for generating the bias voltage Vbias1 for the LVDS driver circuit 202 depicted in FIG. 2. The bias voltage generation circuit depicted in FIG. 3A is an embodiment of the first bias voltage generation circuit 106 depicted in FIG. 1. However, the first bias voltage generation circuit depicted in FIG. 1 is not limited to the embodiment depicted in FIG. 3A.

In the embodiment depicted in FIG. 3A, the bias voltage generation circuit 306 includes an OP-AMP OP1 350, with one input 352 connected to 1.2V bias voltage, which can be the output of a bandgap circuit. The output voltage of the op-amp OP1 is Vbias1, which controls the gate terminal G of an NMOS transistor MN1 356. The drain terminal D of the NMOS transistor MN1 is connected to a supply voltage 358 while the source terminal S of the NMOS transistor MN1 is connected to the ground through a resistor R1 359. The source terminal S of the NMOS transistor MN1 is also connected to the second input 354 of the op-amp OP1. The resistance value of the resistor R1 can be selected such that MN1 is just turned on. The voltage Vbias1 can be expressed as:

$$V_{bias1}=1.2V+V_{th(MN1)} \text{ (approximately)} \quad (7)$$

where $V_{th(MN1)}$ represents the threshold voltage of the NMOS transistor MN1. The voltage Vbias1 is the bias voltage applied to the NMOS transistor MNSF of the LVDS driver circuit depicted in FIG. 2.

Figure 3B:
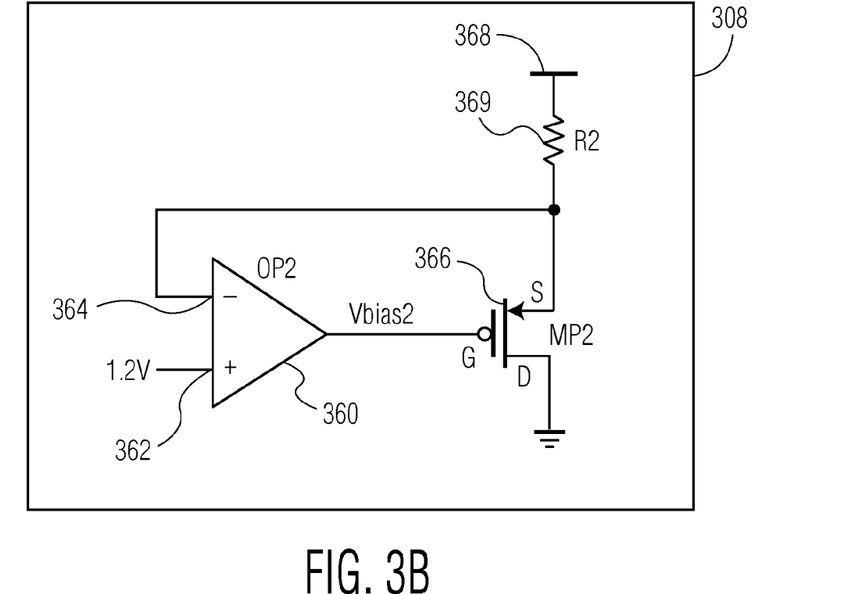
FIG. 3B depicts an embodiment of a second bias voltage generation circuit.

FIG. 3B depicts an embodiment of a bias voltage generation circuit 308 for generating the bias voltage Vbias2 for the LVDS driver circuit 202 depicted in FIG. 2. The bias voltage generation circuit depicted in FIG. 3B is an embodiment of the second bias voltage generation circuit 108 depicted in FIG. 1. However, the second bias voltage generation circuit depicted in FIG. 1 is not limited to the embodiment depicted in FIG. 3B.

In the embodiment depicted in FIG. 3B, the bias voltage generation circuit 308 includes an OP-AMP OP2 360 with one input 362 connected to 1.2V, which can be the output of a bandgap circuit. The output voltage of the OP-AMP OP2 is Vbias2, which controls the gate terminal G of a PMOS transistor MP2 366. The drain terminal D of the PMOS transistor MP2 is connected to the ground whereas the source terminal S of the PMOS transistor MP2 is connected to a supply voltage 368 through a resistor R2 369. The source terminal of the PMOS transistor MP2 is also connected to the second input 364 of the OP-AMP OP2. The resistance value of the resistor R2 can be selected such that the PMOS transistor MP2 is just turned on. The voltage Vbias2 can be expressed as:

$$V_{bias2}=1.2V-V_{th(MP2)} \text{ (approximately)} \quad (8)$$

where $V_{th(MP2)}$ represents the threshold voltage (absolute value) of the PMOS transistor MP2.

The voltage Vbias2 is the bias voltage applied to the PMOS transistor MPSF of the LVDS driver circuit depicted in FIG. 2.

Figure 4:
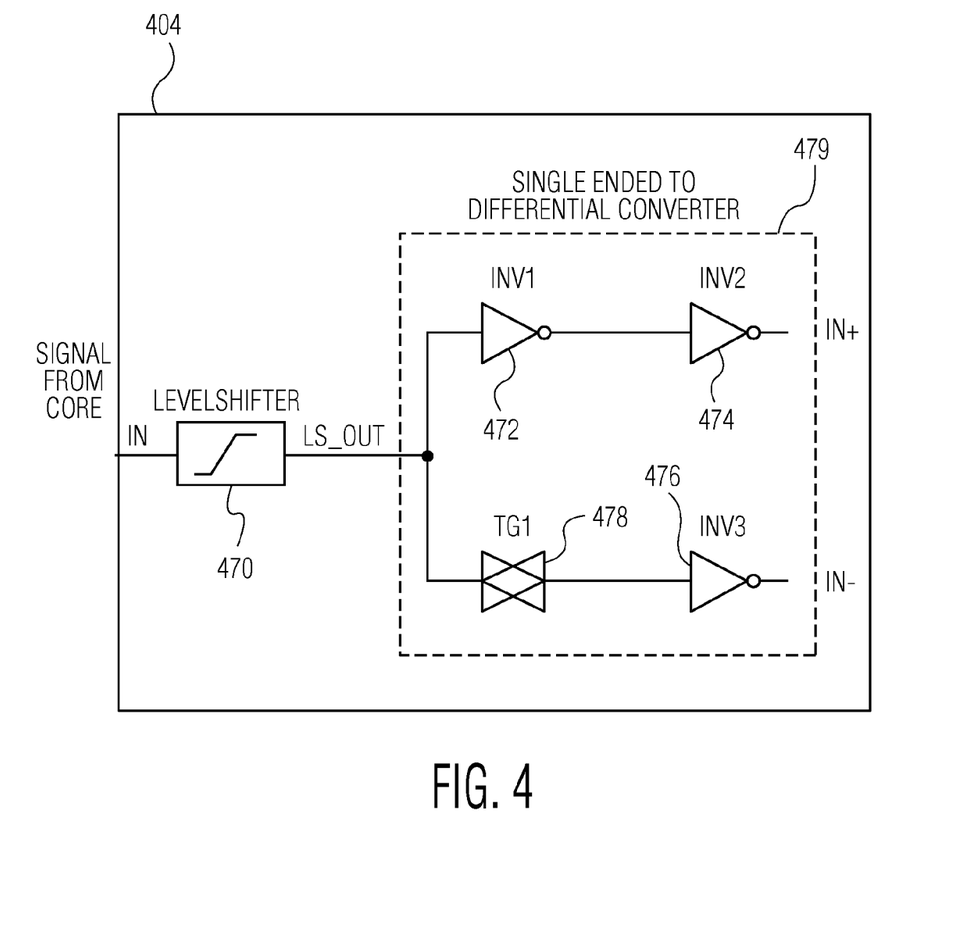
FIG. 4 depicts an embodiment of a complementary signal generation circuit.

FIG. 4 depicts an embodiment of a complementary signal generation circuit 404 that is used to generate complementary digital signals IN+ and IN− for the LVDS driver circuit 202 depicted in FIG. 2. The complementary signal generation circuit depicted in FIG. 4 is an embodiment of the complementary signal generation circuit 104 depicted in FIG. 1.

However, the complementary signal generation depicted in FIG. 1 is not limited to the embodiment depicted in FIG. 4.

In the embodiment depicted in FIG. 4, the complementary signal generation circuit 404 includes a level shifter 470, inverters INV1 472, INV2 474, INV3 476, and a transmission gate TG1 478. The inverters INV1, INV2, INV3 and the transmission gate TG1 form a single-ended-to-differential converter 479. Based on the output signal, "LS_OUT," of the level shifter, the complementary signal generation circuit generates the signal IN+ using two cascaded inverter INV1 and INV2, and generates the signal IN− using the transmission gate TG1 and the inverter INV3. In some embodiments, the inverters INV2 and INV3 are matched in size and the delay of the transmission gate TG1 is matched with inverter INV1. In these embodiments, symmetrical complementary signal IN+ and IN− with high accuracy can be generated.

Figure 5A:
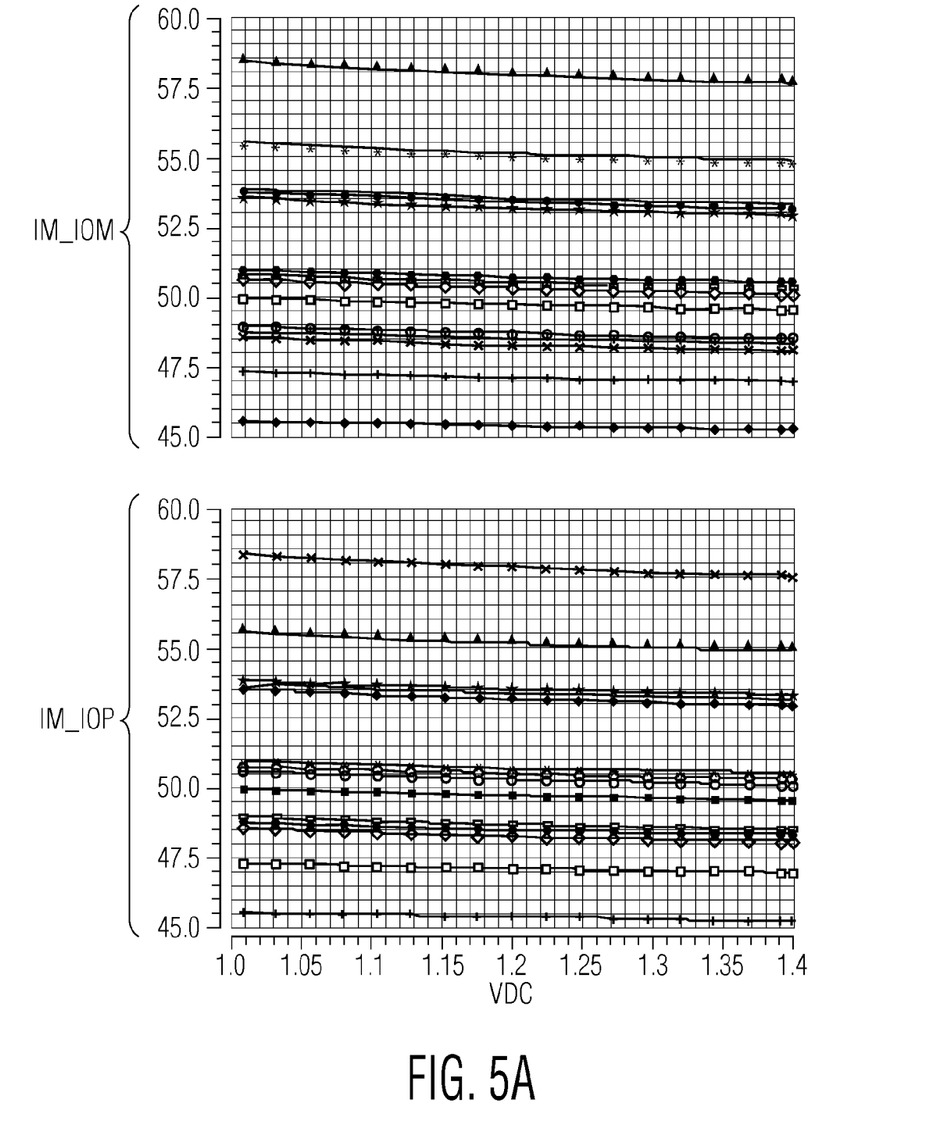
FIG. 5A shows a diagram of simulated values of output impedances at output terminals of the LVDS driver circuit depicted in FIG. 2 versus the voltages at the output terminals.
Figure 5B:
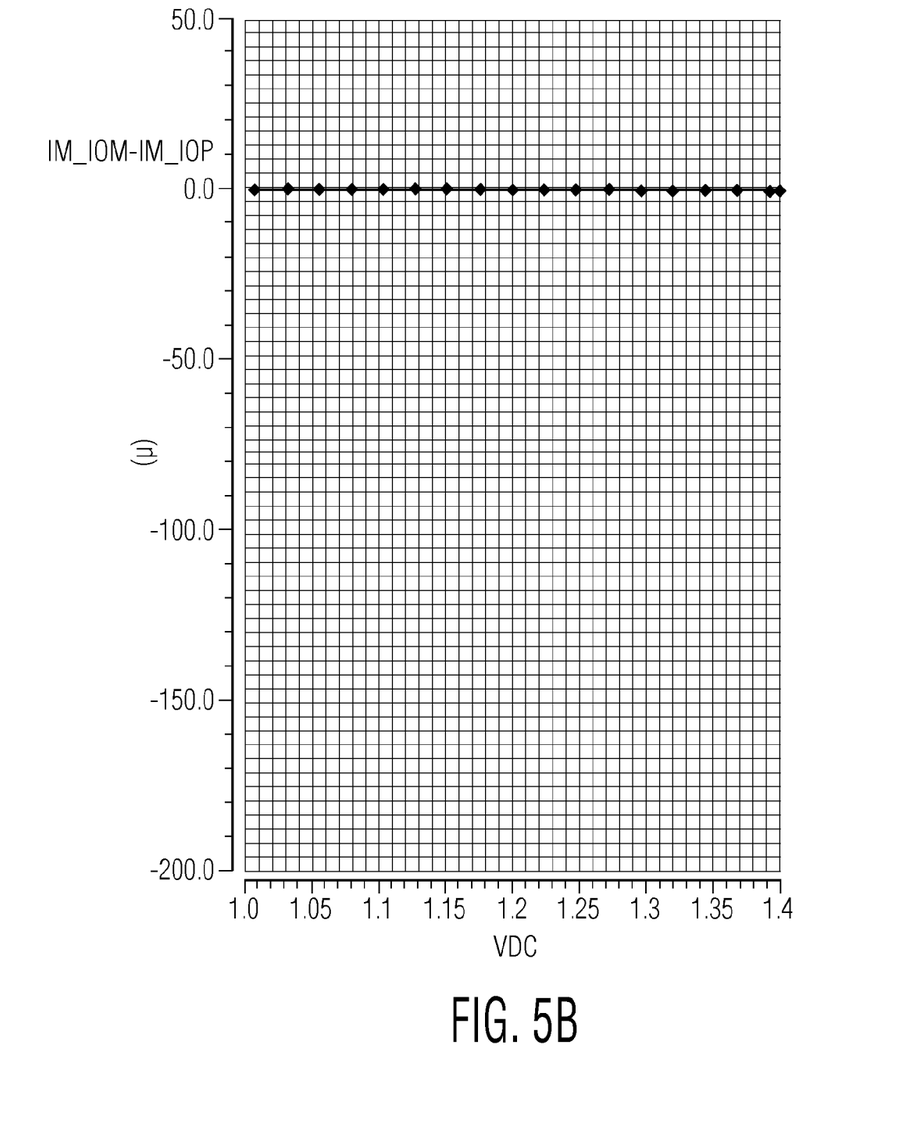
FIG. 5B shows a diagram of simulated values of the difference between the output impedances at the output terminals of the LVDS driver circuit depicted in FIG. 2 versus the voltages at the output terminals.

FIG. 5A shows a diagram of simulated values of the output impedances at the output terminals IOP and TOM of the LVDS driver circuit 202 depicted in FIG. 2 versus the voltages at the output terminals IOP and IOM. In some embodiments, the output impedances at the output terminals IOP and TOM are measured by shorting both the output terminals IOP and TOM and sweep voltage from 1V to 1.4V. Specifically, FIG. 5A includes a first plot (at left top) that shows the values of the output impedance at the output terminal TOM (IM_IOM) and a second plot (at left bottom) that shows the values of the output impedance at the output terminal IOP (IM_IOP). These output impedances are plotted with respect to the output voltage sweep from 1.0V to 1.4V and across different operating conditions:

Process: Nominal, Fast and Slow
Supply voltage: Nominal, Maximum and minimum (eg. 1.8V, 1.98V, 1.62V for 1.8V power supply)
Temperature: 25 C, −40 C, 125 C FIG. 5B shows a diagram of simulated values of the difference between the output impedances at the output terminals IOP and TOM of the LVDS driver circuit depicted in FIG. 2 versus the voltages at the output terminals IOP and IOM. The output impedances at the output terminals IOP and TOM are matching across all operating conditions. As shown in FIG. 5B, the difference between the output impedances at the output terminals IOP and TOM is zero across different operating conditions.

Figure 6:
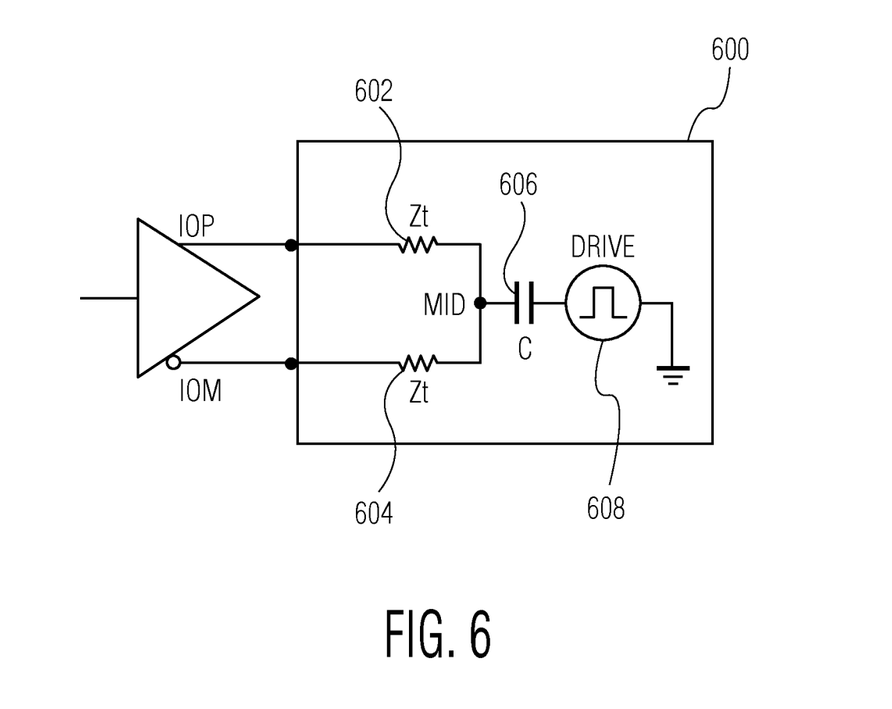
FIG. 6 depicts a circuit for testing the dynamic output impedances and their mismatch at the output terminals of the LVDS driver circuit depicted in FIG. 2.

FIG. 6 depicts a circuit 600 for testing the dynamic output impedances and their mismatch at the output terminals IOP and TOM of the LVDS driver circuit 202 depicted in FIG. 2. The circuit includes two resistors 602, 604 with a resistance value Zt, a capacitor 606, and a voltage source 608. The circuit is described in LVDS standard IEEE Standard 1596.3-1996. According to LVDS standard IEEE Std 1596.3-1996:

Zt=50-ohm
C=0.033 uF
Voltage source=500 mV peak-to-peak, 10 MHz

According to LVDS standard IEEE Std 1596.3-1996, voltage difference between TOM and TOM should be less than 50 mV, which shows the impedance mismatch between the output terminals IOP and TOM is limited to 10%.

Figure 7:
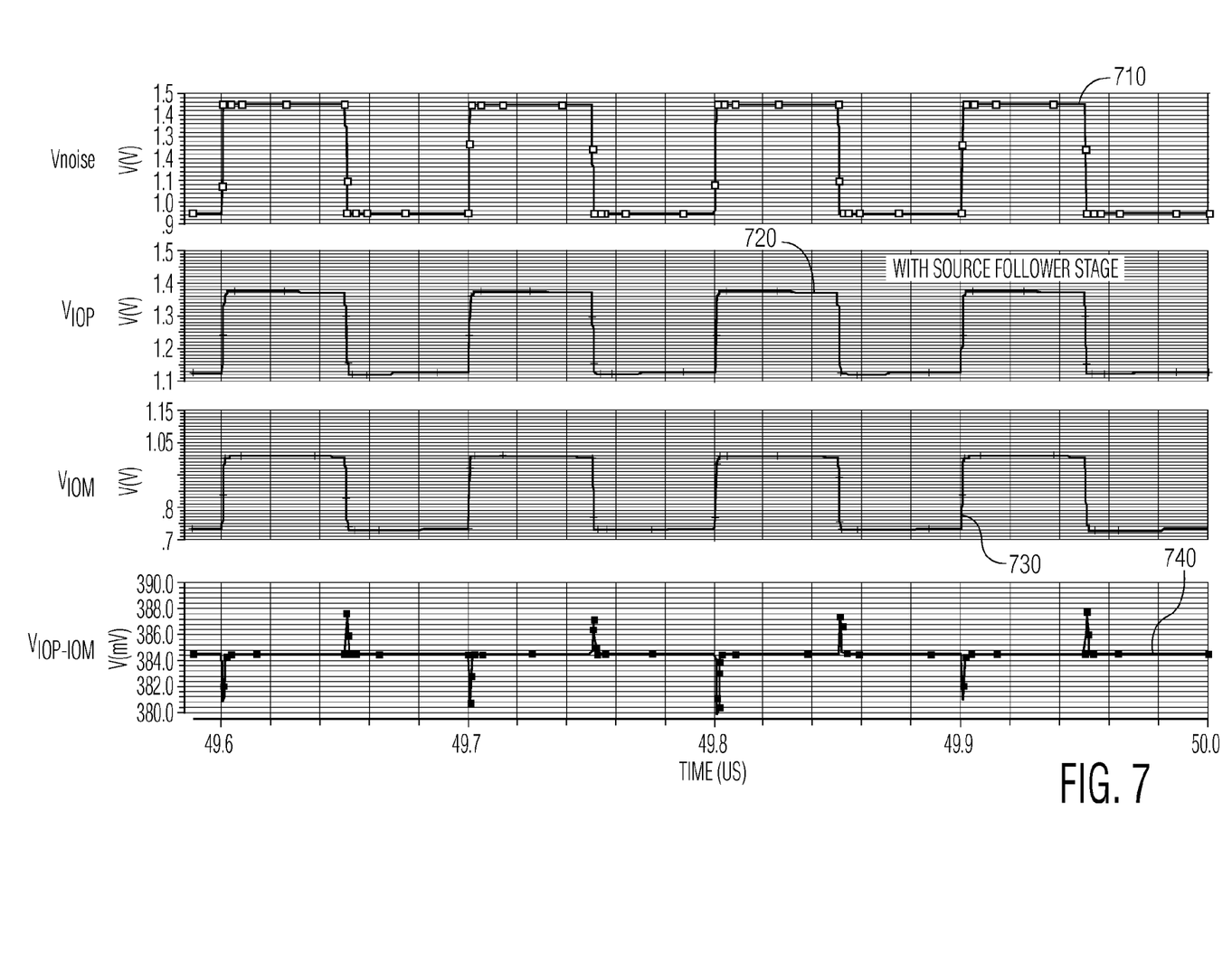
FIG. 7 shows a diagram of waveforms associated with the circuit depicted in FIG. 6.

FIG. 7 shows a diagram of waveforms associated with the circuit 600 depicted in FIG. 6. In the waveforms shown in FIG. 7, Vnoise represents the waveform 710 of the injected noise, $V_{IOP}$ represents the waveform 720 of the output voltage at the output terminal TOP, $V_{IOM}$ represents the waveform 730 of the output voltage at the output terminal TOM, and $V_{IOP-IOM}$ represents the waveform 740 of the difference between the output voltages at the output terminals IOP and TOM. The waveforms $V_{IOP}$ and $V_{IOM}$ have a swing that is half of the waveform Vnoise, due to 50-ohm output impedance at TOP and TOM. As shown in FIG. 7, the waveform is close to zero, which shows that there is almost negligible difference between voltages at the output terminals TOP and TOM and proves that the common mode noise is not converted into differential noise.

Figure 8:
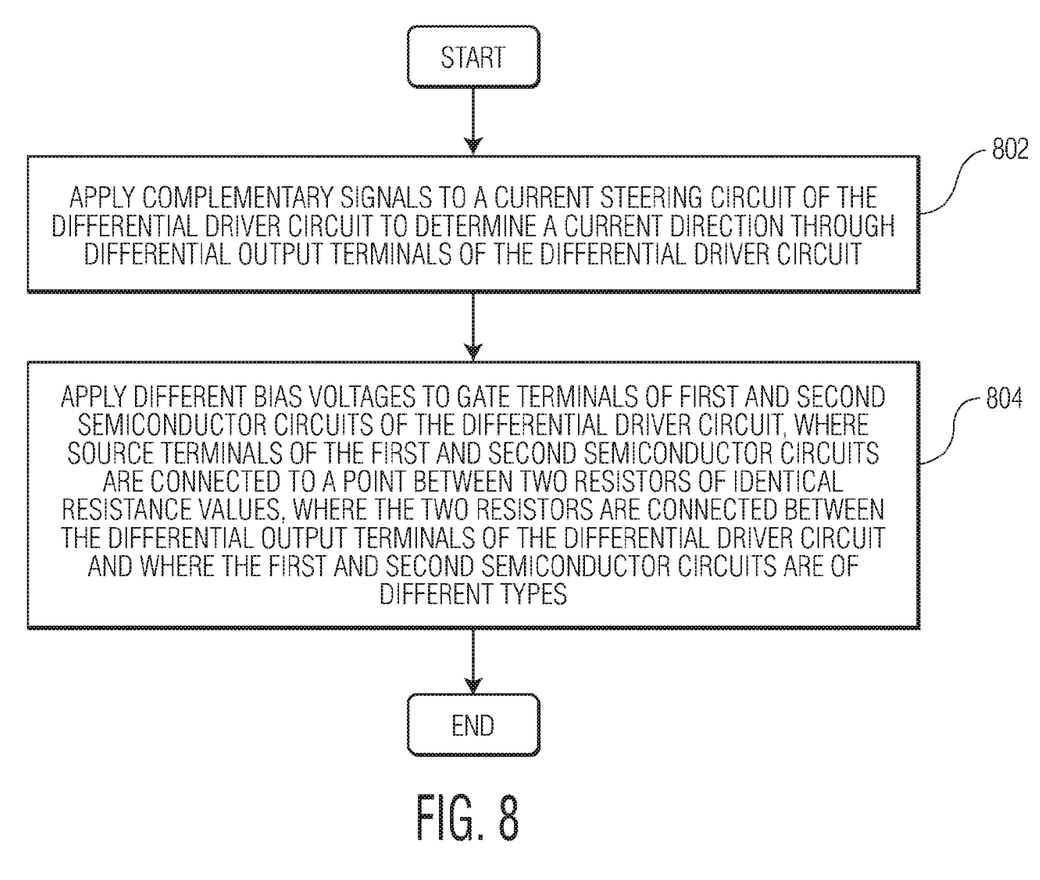
FIG. 8 depicts a flowchart diagram of one embodiment of a method for controlling a differential driver circuit.

FIG. 8 depicts a flowchart diagram of one embodiment of a method for controlling a differential driver circuit. At block 802, complementary signals are applied to a current steering circuit of the differential driver circuit to determine a current direction through differential output terminals of the differential driver circuit. At block 804, different bias voltages are applied to gate terminals of first and second semiconductor circuits of the differential driver circuit. Source terminals of the first and second semiconductor circuits are connected to a point between two resistors of identical resistance values. The two resistors are connected between the differential output terminals of the differential driver circuit and the first and second semiconductor circuits are of different types. The differential driver circuit may be the same as or similar to the differential driver circuit 102 depicted in FIG. 1 and/or the LVDS driver circuit 202 depicted in FIG. 2.

It should also be noted that at least some of the operations for the methods described herein may be implemented using firmware or software instructions stored on a readable storage medium for execution by a programmable logic device, such as an Application Specific Integrated Circuit (ASIC), a Field Programmable Gate Array (FPGA), a Programmable Logic Chip (PLC), a processor, or the like. As an example, an embodiment of a program product includes a firmware package stored on a flash memory device and configured to cause an FPGA to perform the operations described herein.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A differential driver circuit, the differential driver circuit comprising:
   a current steering circuit configured to determine a current direction through differential output terminals of the differential driver circuit;
   two resistors connected between the differential output terminals of the differential driver circuit; and
   first and second semiconductor circuits connected to a point between the two resistors, wherein the first and second semiconductor circuits are of different types and wherein source terminals of the first and second semiconductor circuits are connected to the point between the two resistors.

2. The differential driver circuit of claim 1, wherein resistance values of the two resistors are identical to each other.

3. The differential driver circuit of claim 2, wherein gate terminals of the first and second semiconductor circuits are connected to different bias voltages.

4. The differential driver circuit of claim 3, wherein the first semiconductor circuit comprises an NMOS transistor, wherein the second semiconductor circuit comprises a PMOS transistor, wherein a gate terminal of the NMOS transistor is connected to a first bias voltage and wherein a gate terminal of the PMOS transistor is connected to a second bias voltage.

5. The differential driver circuit of claim 4, wherein a difference between the first bias voltage and the second bias voltage is equal to a sum of threshold voltages of the NMOS transistor and the PMOS transistor.

6. The differential driver circuit of claim 5, wherein the first bias voltage is equal to a sum of a reference voltage and the threshold voltage of the NMOS transistor and wherein the second bias voltage is equal to a voltage difference between the reference voltage and the threshold voltage of the PMOS transistor.

7. The differential driver circuit of claim 2, wherein drain terminals of the first and second semiconductor circuits are connected to different supply voltages.

8. The differential driver circuit of claim 7, wherein the first semiconductor circuit comprises an NMOS transistor, wherein the second semiconductor circuit comprises a PMOS transistor, wherein a drain terminal of the NMOS transistor is connected to a positive supply voltage and wherein a drain terminal of the PMOS transistor is connected to the ground.

9. The differential driver circuit of claim 2, wherein the current steering circuit is configured to determine the current direction through the differential output terminals of the differential driver circuit based on complementary signals.

10. The differential driver circuit of claim 9, wherein the current steering circuit comprises a first PMOS transistor, a second PMOS transistor, a first NMOS transistor and a second NMOS transistor, wherein gate terminals of the first and second PMOS transistors are connected to the complementary signals and wherein gate terminals of the first and second NMOS transistors are connected to the complementary signals.

11. The differential driver circuit of claim 10, wherein the differential output terminals of the differential driver circuit comprise a first differential output terminal and a second differential output terminal, wherein the first differential output terminal is connected to drain terminals of the first PMOS transistor and the first NMOS transistor and wherein the second differential output terminal is connected to drain terminals of the second PMOS transistor and the second NMOS transistor.

12. The differential driver circuit of claim 11, further comprising a current source and a current sink, wherein the current source is connected to source terminals of the first and second PMOS transistors and wherein the current sink is connected to source terminals of the first and second NMOS transistors.

13. The differential driver circuit of claim 1, wherein the differential driver circuit is a Low Voltage Differential Signalling (LVDS) driver circuit.

14. A differential driver system comprises the differential driver circuit of claim 1, a complementary signal generation circuit configured to generate complementary signals for the differential driver circuit and a plurality of bias voltage generation circuits configured to generate bias voltages for the differential driver circuit.

15. A Low Voltage Differential Signalling (LVDS) driver circuit, the LVDS driver circuit comprising:
a current steering circuit configured to determine a current direction through differential output terminals of the LVDS driver circuit;
two resistors connected between the differential output terminals of the LVDS driver circuit, wherein resistance values of the two resistors are identical to each other; and
an NMOS transistor and a PMOS transistor connected to a point between the two resistors, wherein source terminals of the NMOS transistor and the PMOS transistor are connected to the point between the two resistors and wherein gate terminals of the NMOS transistor and the PMOS transistor are connected to different bias voltages.

16. The LVDS driver circuit of claim 15, wherein a drain terminal of the NMOS transistor is connected to a positive supply voltage and wherein a drain terminal of the PMOS transistor is connected to the ground.

17. The LVDS driver circuit of claim 16, wherein the gate terminal of the NMOS transistor is connected to a first bias voltage, wherein the gate terminal of the PMOS transistor is connected to a second bias voltage, wherein the first bias voltage is equal to a sum of a reference voltage and a threshold voltage of the NMOS transistor and wherein the second bias voltage is equal to a voltage difference between the reference voltage and a threshold voltage of the PMOS transistor.

18. The LVDS driver circuit of claim 17, wherein the differential output terminals of the differential driver circuit are connected to drain terminals of a plurality of PMOS transistors and a plurality of NMOS transistors of the current steering circuit.

19. The LVDS driver circuit of claim 18, further comprising a current source and a current sink, wherein the current source is connected to source terminals of the PMOS transistors of the current steering circuit and wherein the current sink is connected to source terminals of the NMOS transistors of the current steering circuit.

20. A method for controlling a differential driver circuit, the method comprising:
applying complementary signals to a current steering circuit of the differential driver circuit to determine a current direction through differential output terminals of the differential driver circuit; and
applying different bias voltages to gate terminals of first and second semiconductor circuits of the differential driver circuit, wherein source terminals of the first and second semiconductor circuits are connected to a point between two resistors of identical resistance values, wherein the two resistors are connected between the differential output terminals of the differential driver circuit and wherein the first and second semiconductor circuits are of different types.

* * * * *